United States Patent
Chen et al.

(10) Patent No.: US 7,915,065 B2
(45) Date of Patent: Mar. 29, 2011

(54) WAFER LEVEL SENSING PACKAGE AND MANUFACTURING PROCESS THEREOF

(75) Inventors: Lung-Tai Chen, Fongshan (TW);
Chun-Hsun Chu, Tainan (TW);
Tzong-Che Ho, Hsinchu (TW);
Bor-Chen Tsai, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/331,539

(22) Filed: Dec. 10, 2008

(65) Prior Publication Data

US 2009/0124074 A1    May 14, 2009

Related U.S. Application Data

(62) Division of application No. 12/073,392, filed on Mar. 5, 2008, now abandoned.

(30) Foreign Application Priority Data

Nov. 14, 2007    (TW) ................................ 96143100 A

(51) Int. Cl.
*H01L 21/00* (2006.01)
(52) U.S. Cl. ................ 438/48; 438/51; 438/55; 438/64; 438/614; 257/E21.575; 257/E23.02; 257/E23.021
(58) Field of Classification Search ........... 257/E23.012, 257/E23.02, E23.021, E21.575; 438/29, 438/53, 98, 48, 51, 55, 64, 614
See application file for complete search history.

(56) References Cited

U.S. PATENT DOCUMENTS

| | | | |
|---|---|---|---|
| 5,719,069 A | 2/1998 | Sparks | |
| 6,235,552 B1 * | 5/2001 | Kwon et al. | 438/106 |
| 6,350,705 B1 | 2/2002 | Lin et al. | |
| 6,621,164 B2 | 9/2003 | Hwang et al. | |
| 6,756,671 B2 | 6/2004 | Lee et al. | |
| 6,790,759 B1 | 9/2004 | Wang et al. | |
| 2006/0030070 A1 * | 2/2006 | Leu et al. | 438/106 |
| 2006/0073693 A1 * | 4/2006 | Huang | 438/613 |
| 2006/0091515 A1 | 5/2006 | Weng et al. | |
| 2006/0138671 A1 * | 6/2006 | Watanabe | 257/773 |
| 2006/0292851 A1 * | 12/2006 | Lin et al. | 438/618 |
| 2007/0052046 A1 | 3/2007 | Chu et al. | |

FOREIGN PATENT DOCUMENTS

KR    10-2009-0049974 A    5/2009

\* cited by examiner

*Primary Examiner* — Lex Malsawma
*Assistant Examiner* — Robert Huber
(74) *Attorney, Agent, or Firm* — Rabin & Berdo, P.C.

(57) ABSTRACT

A wafer level sensing package and manufacturing process thereof are described. The process includes providing a wafer having sensing chips, in which each sensing chip has a sensing area and pads; forming a stress release layer on a wafer surface; cladding a photoresist layer on the stress release layer; patterning the photoresist layer to expose the pads and a portion of the stress release layer, without exposing opening areas of the sensing areas; forming a conductive metal layer of re-distributed pads on the portion of the stress release layer exposed by the photoresist layer; removing the photoresist layer; forming a re-cladding photoresist layer on the stress release layer and the conductive metal layer; forming holes in the re-cladding photoresist layer above the re-distributed pad area; and forming conductive bumps in the holes to electrically connect to the conductive metal layer.

10 Claims, 6 Drawing Sheets

WAFER LEVEL SENSING PACKAGE AND MANUFACTURING PROCESS THEREOF

CROSS-REFERENCE TO RELATED APPLICATIONS

This is a division of U.S. application Ser. No. 12/073,392, filed Mar. 5, 2008, which claimed Priority from Taiwanese application No. 096143100, filed Nov. 14, 2007, the entire disclosure of which is incorporated herein by reference.

BACKGROUND OF THE INVENTION

1. Field of Invention

The present invention relates to a wafer level sensing package and a manufacturing process thereof, and more particularly to a package and manufacturing process capable of preventing sensing areas from being contaminated during the re-distributing manufacturing process of the sensing wafer and reducing the volume of the package.

2. Related Art

For the current microelectromechanical (MEMS) industry, although the MEMS elements are characterized in miniaturization and integration, the total device cost has remained at a very high level, and thus application of MEMS elements is very limited. Under the impact of individuation and popularization of global communication, it is common to see people each having a cell phone or several phones. Even children just entering school may use cell phones for keeping in contact with their parents. Thus, the consumer group of cell phones greatly expands to encompass children under ten years old, which significantly increases the demands for the phones. Moreover, a research report from Topology in September 2005 pointed out that the number of the global delivered cell phones in 2005 was about 0.760 billion, and the number of the cell phone subscribers would reach 1.685 billion. Meanwhile, it is estimated that the number of the global cell phone subscribers will reach 2.236 billion in 2009. Therefore, the scale of the cell phone market is too large to ignore.

As far as the product properties and design notions of the cell phones, besides basic call function, other functions such as image communication, wireless data communication, network connection, time display, alarm clock, memo, global time-zone, E-mail, personal assistant, GPS navigation, satellite positioning and tracking, e-map, wireless remote control, MP3 music, real-time image, digital photography, digital program reception, horizontal elevation, monitoring alarm, digital game machine, radio, extended memory are also incorporated. Due to the everlasting expansion of functions of a single set, the number of the elements in a cell phone and the probability of device integration may be greatly increased. Unfortunately, in order to meet the consumers' demands for "light, thin, short, small" products, the body volume of a cell phone cannot be enlarged with the expansion of the functions. On the contrary, the whole size of the cell phone is limited within a certain range or even is reduced in accordance with the selling point of "light and chic". In another aspect, the cell phones have already been plain products in the global market, so the total cost of the cell phones is confined within a reasonable range, and the cell phones cannot be sold at a high price like high-tech equipments or parts. Thus, how to cut down the total cost of the elements employed in a cell phone becomes a challenge in design. Therefore, the mode of mass production at a low cost has become a design criteria and principle for all the elements used in a cell phone, and is also a trend of technical study.

In the cost architecture of the MEMS elements, the packaging cost accounts for 70% to 80% of the total cost of the MEMS elements. Thus, the packaging cost has become the initial essential topic and also the most effective and important way for reducing the cost of the MEMS elements. Moreover, the global wafer level packages still focus on the application of semiconductor packaging, and the structural design considers the problem of the reliability caused by the CTE mismatch between the semiconductor devices and the printed circuit boards in the application of elements in the future. Thus, the wafer level package is designed with an stress release layer and re-arranged wires and pads of a conductive metal layer. Thus, the currently known prior arts mainly focus on the design and format of changing the re-distribution of the wires. Therefore, most of the patents, such as U.S. Pat. No. 6,756,671, U.S. Pat. No. 6,621,164, U.S. Pat. No. 6,790,759, and U.S. Pat. No. 6,350,705, have a common problem that does not disclose the need of forming an opening of the sensing area in the stress release layer. In those wafer level packaging techniques (referring to FIGS. 1A to 1D), a process of adding the re-distributed wires completely on the wafer to form a conductive metal layer between the stress release layer and the original chip pad is adopted. As the stress release layer 11 above the conventional semiconductor wafer 10 covers the entire surface of the wafer 10 except the area of the chip pad 12, the conductive metal layer 14 formed by the patterned photoresist 13 will not contact the chip surface of the wafer 10 during the adding process. However, when this technique is applied to a sensing wafer with an open space, each sensing chip has a sensing area, and the sensing area must keep in contact with the outside during the whole packaging process. That is, as for the sensing wafer, in the wafer level packaging process, the stress release layer must not cover the sensing area of each chip besides the chip pad area. Otherwise, during the subsequent process of adding a conductive metal layer to the wafer, the added metal layer may be formed on the sensing area of each sensing chip of the wafer simultaneously. As such, the material of the sensing layer may be contaminated or the sensing design may be altered, resulting in the failure, decay, deterioration, or non-operation of the sensing function of the sensing layer.

SUMMARY OF THE INVENTION

Accordingly, in order to solve the above problem, the present invention is directed to a wafer level sensing package and a manufacturing process thereof, so as to prevent the material of the sensing area from being contaminated during the process of adding a conductive metal layer to the wafer and meanwhile to reduce the volume of the package.

To solve the above problem, a technical solution of the present invention is a manufacturing process of a wafer level sensing package. The manufacturing process includes: providing a wafer having a plurality of sensing chips, in which each sensing chip has a sensing area and a plurality of pads; forming a stress release layer on a wafer surface to expose the sensing area and the pads; cladding a photoresist layer on the stress release layer to shelter the sensing area and the pads; patterning the photoresist layer to expose the pads and a portion of the stress release layer electrically connected to the pads; forming a conductive metal layer having a plurality of re-distributed pads on the portion of the stress release layer exposed by the photoresist layer; removing the photoresist layer to expose the stress release layer and the conductive metal layer; forming a re-cladding photoresist layer on the stress release layer and the conductive metal layer again to shelter the sensing area and the pads; patterning the re-cladding photoresist layer to form holes in the re-cladding photoresist layer above the re-distributed pad area; and forming a conductive bump in each hole to electrically connect to the conductive metal layer.

To solve the above problem, a technical solution of the present invention is a wafer level sensing package. The package includes a wafer having a plurality of sensing chips and a plurality of scribe lines, in which each sensing chip has an active surface, and the active surface further has a sensing area and a plurality of pads; a stress release layer, located on the active surface of each sensing chip, and exposing the sensing area and the pads; a conductive metal layer, disposed on the surface of the stress release layer and electrically coupled to the pads, in which a plurality of re-distributed pads is formed on the conductive metal layer; and a plurality of conductive bumps, electrically coupled to each of the re-distributed pads respectively.

The above embodiments of the present invention have the following effects. According to the present invention, a photoresist is first covered on the sensing area of each sensing chip of the sensing wafer so as to prevent the sensing area from being contaminated during the process of forming a conductive metal layer of the wafer. Further, during the subsequent process, the photoresist is removed, and thus it is unnecessary to add a transmissive protective spacer on the wafer surface as that in the conventional sensing wafer, thereby reducing the overall volume of the package.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Preferred embodiments accompanied with figures are described in detail below.

Figure 1A:
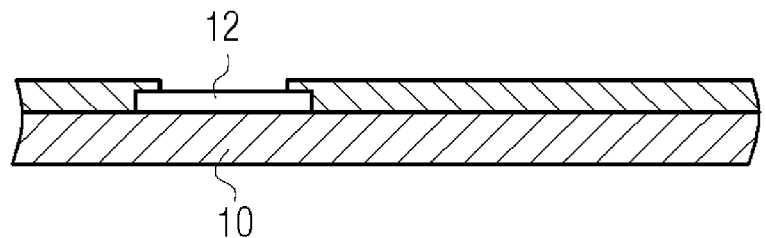
FIGS. 1A to 1D are schematic structural views of a process of adding a conductive metal layer to a wafer in the prior art.
Figure 1B:
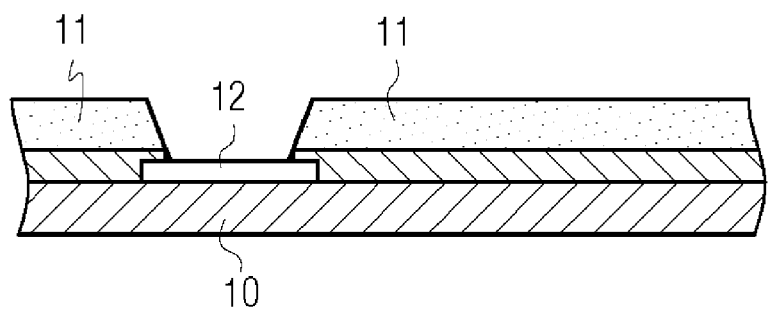
Figure 1C:
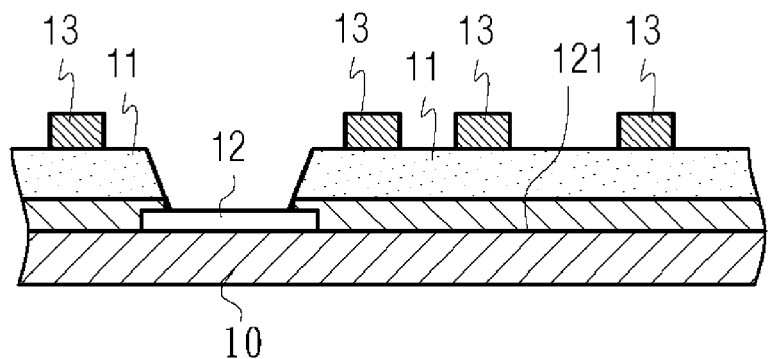
Figure 1D:
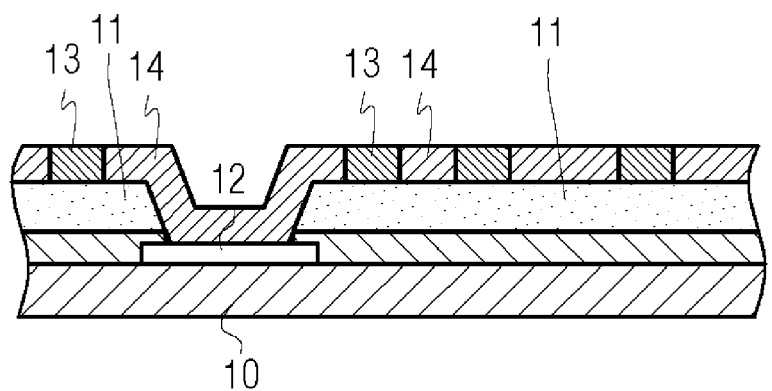
Figure 2A:
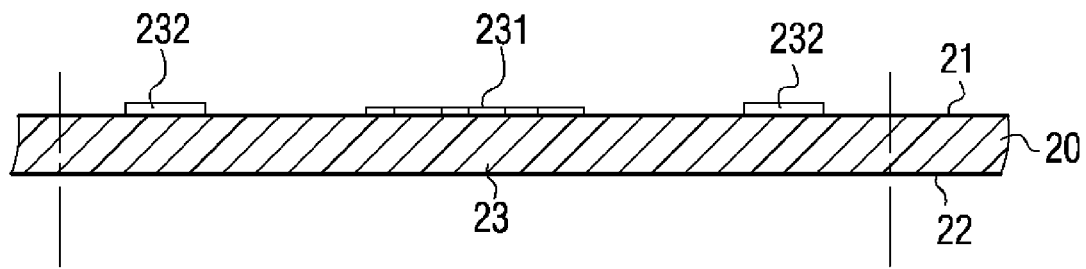
FIGS. 2A to 2K are schematic structural views of a manufacturing process of a wafer level sensing package according to an embodiment of the present invention.
Figure 2B:
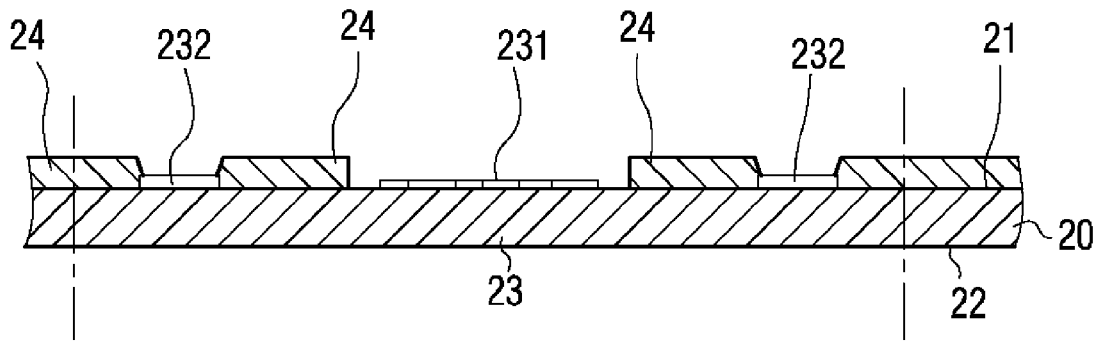
Figure 2C:
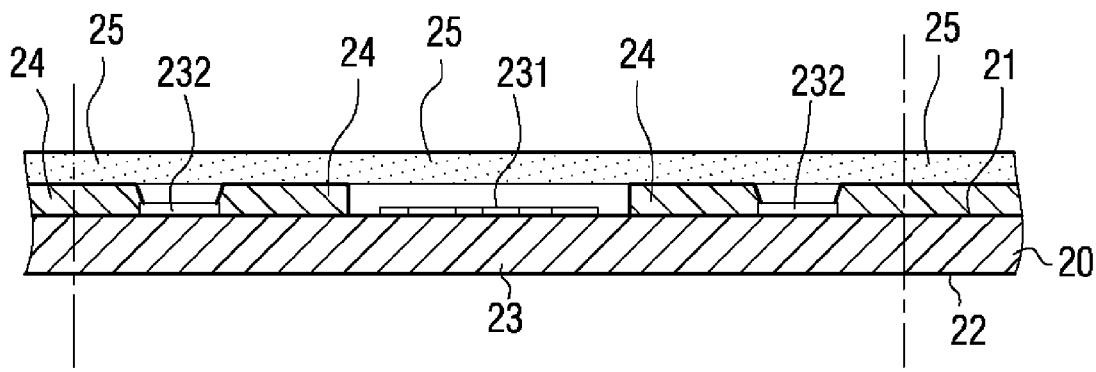
Figure 2D:
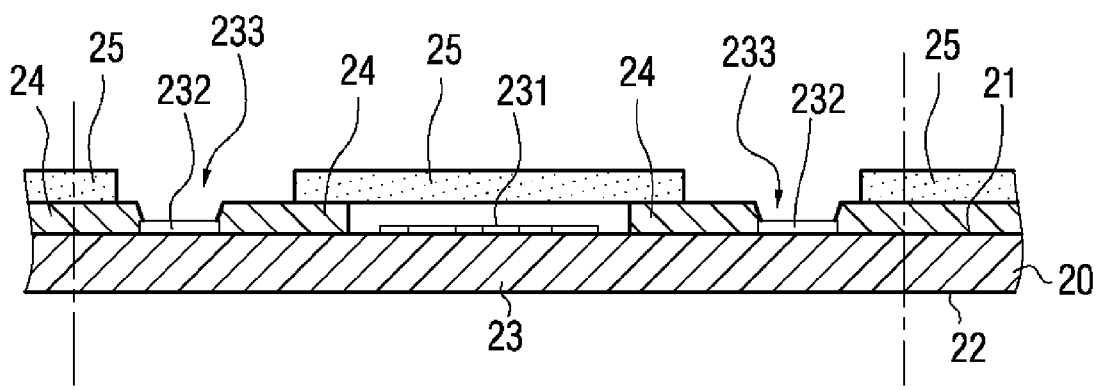
Figure 2E:
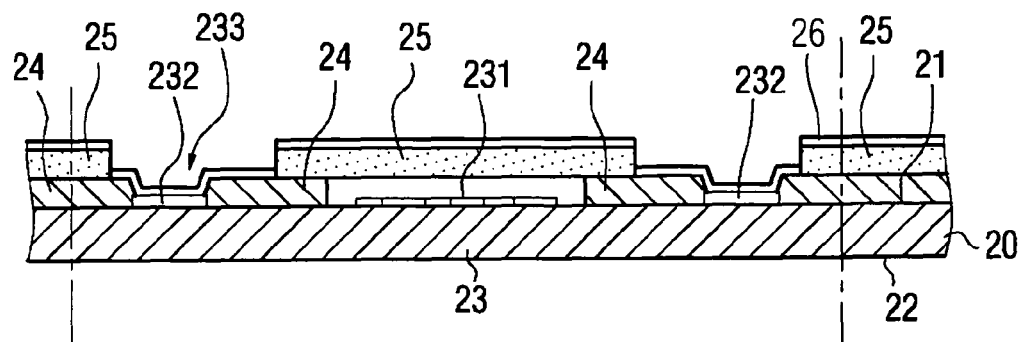
Figure 2F:
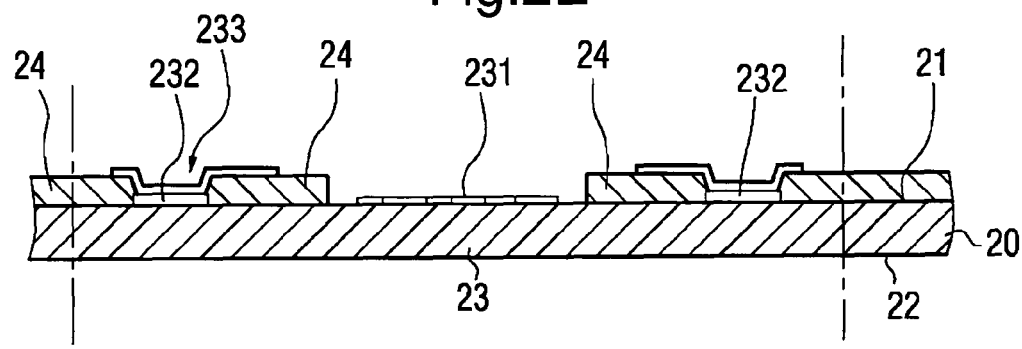
Figure 2G:
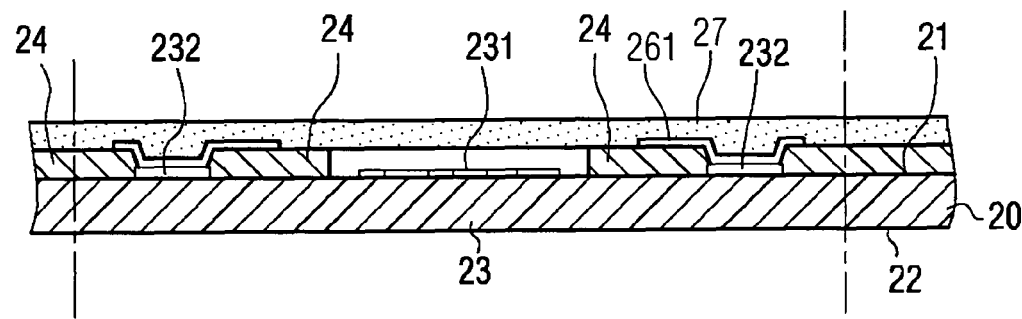
Figure 2H:
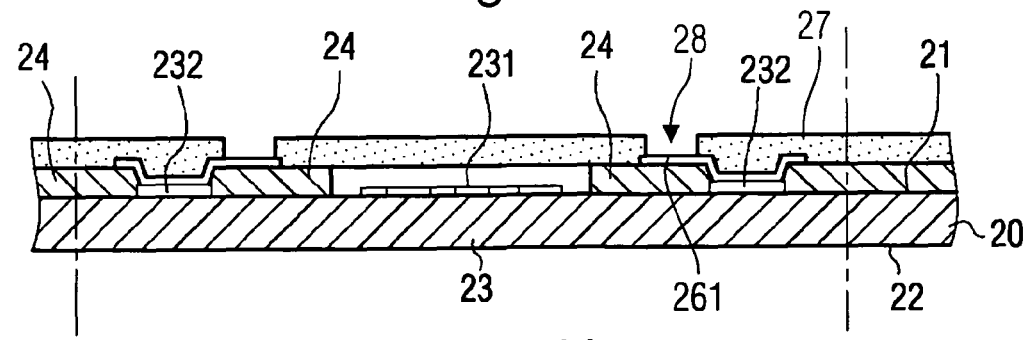
Figure 2I:
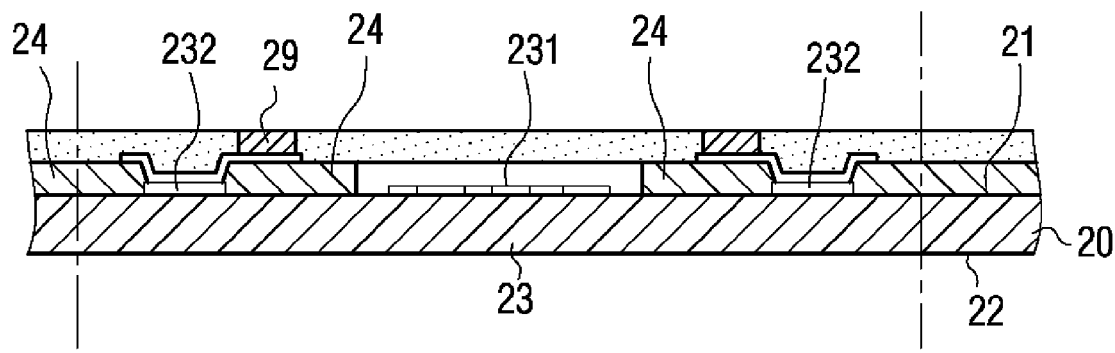
Figure 2J:
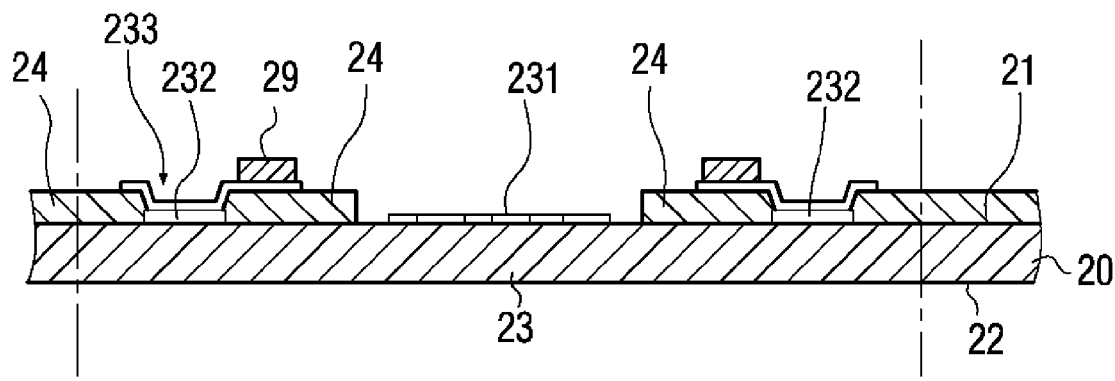
Figure 2K:
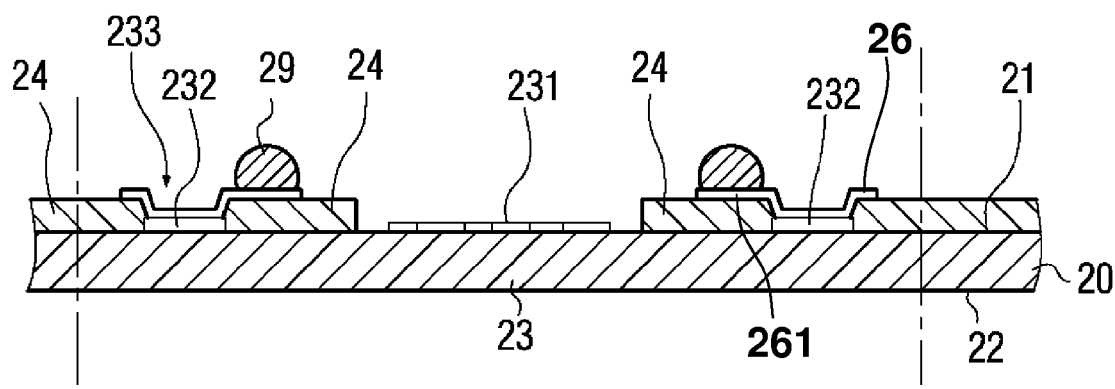
Figure 3A:
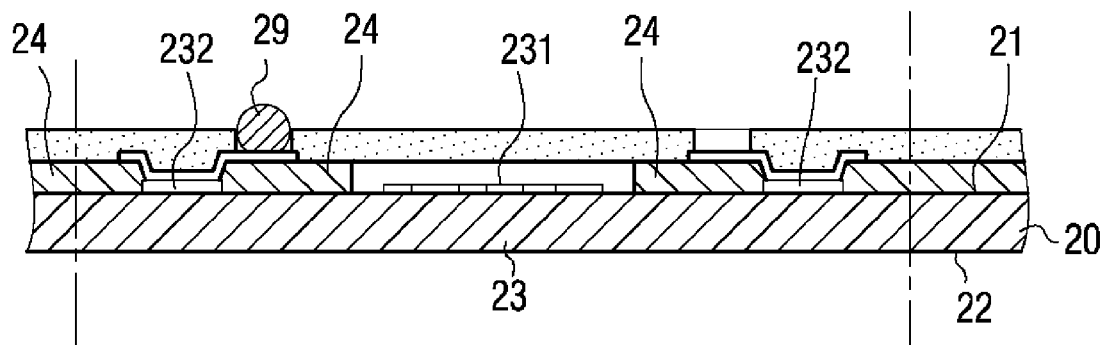
FIGS. 3A to 3B show a wafer bump formed by a ball implantation technique after FIG. 2H.
Figure 3B:
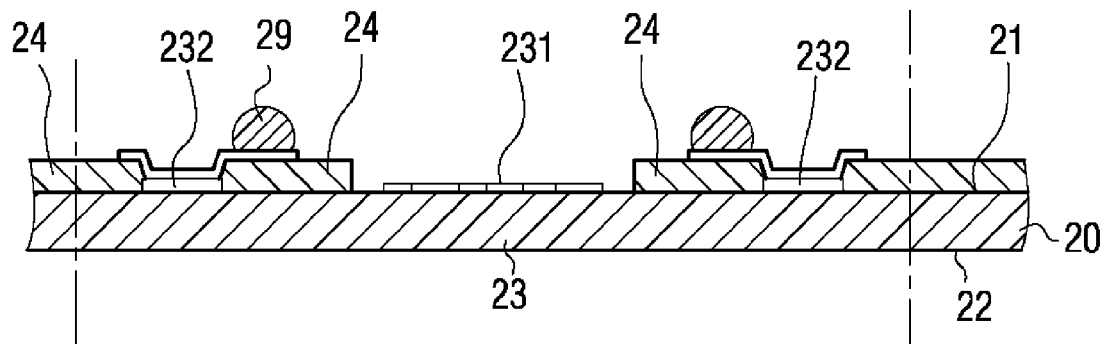

Referring to FIGS. 2A to 2K, schematic structural views of a manufacturing process of a wafer level sensing package according to an embodiment of the present invention are shown. The process includes the following steps. First, a wafer 20, particularly a sensing wafer, is provided. The wafer 20, constituted by a plurality of sensing chips 23, has a wafer surface 21 and a wafer backside 22 opposite to the wafer surface 21. Each sensing chip 23 on the wafer surface 21 has a sensing area 231 and a plurality of pads 232 (as shown in FIG. 2A). Next, a stress release layer 24 is formed on the wafer surface 21, in which the stress release layer 24 is mainly used for providing stress buffer, and is thus also referred to as a stress buffer layer. The stress release layer 24 exposes the sensing area 231 and the pads 232 of each sensing chip 23 (as shown in FIG. 2B). Thereafter, a photoresist layer 25 is cladded on the stress release layer 24, for sheltering the sensing area 231 and the pads 232 (as shown in FIG. 2C). Then, the photoresist layer 25 is patterned to expose the pads 232 and a portion of the stress release layer 24. The exposed portion of the stress release layer 24 is connected to the pads 232 (as shown in FIG. 2D). After that, a conductive metal layer 26 is formed on the stress release layer 24 exposed by the photoresist layer 25, and has a plurality of re-distributed pads 261 with re-distributed positions (as shown in FIG. 2E). Then, the photoresist layer 25 is removed, and the conductive metal layer 26 attached on the photoresist layer 25 in the preceding step is also removed to expose the stress release layer 24 and the conductive metal layer 26 (as shown in FIG. 2F). Afterwards, a re-cladding photoresist layer 27 is formed on the stress release layer 24 and the conductive metal layer 26, for sheltering the sensing area 231, the pads 232, and the re-distributed pads 261 (as shown in FIG. 2G). The re-cladding photoresist layer 27 is then patterned to form a plurality of holes 28 in the re-cladding photoresist layer 27 above the re-distributed pads 261 (as shown in FIG. 2H). Finally, a conductive bump 29 is formed in every hole 28 by a conventional wafer bump forming technique such as electro-plating or stencil printing, so as to be electrically coupled to the conductive metal layer 26, such that a wafer level sensing package is formed (as shown in FIGS. 2I to 2K). Definitely, the above process (as shown in FIGS. 2I to 2K) of forming a conductive bump may also include directly disposing a solder ball in each hole 28, in which the hole 28 is pre-coated with a solder flux or solder paste for the adhesion of the solder ball (as shown in FIGS. 3A and 3B). As shown in FIGS. 2J and 2K, the re-cladding photoresist layer 27 is removed to expose the sensing area 231.

Definitely, the above step of forming a conductive bump 29 further includes a step of removing the re-cladding photoresist layer 27 and a step of performing a reflow process. In addition, the step of removing the re-cladding photoresist layer 27 may also be performed after the step of performing a reflow process.

In the above embodiment of the present invention, the conductive metal layer is formed by electroplating, vapor deposition, or sputtering.

In the above embodiment of the present invention, after the step of forming a conductive bump 29 in each hole 28 to electrically connect to the conductive metal layer, a step of cutting along adjacent positions, i.e., reserved scribe lines 50 of each sensing chip 23 of the wafer 20 is performed to form a plurality of granular sensing chip packages.

In the above embodiment, the composition of the stress release layer 24 is PI, BCB, silica gel, or the like.

In the above embodiment of the present invention, the photoresist layer 25 is added by a general thick film forming process such as stencil printing, spin-coating, or preformed plastic hot pressing.

Then, referring to FIG. 2D, in this embodiment, the sensing wafer structure with stress release layer includes a wafer 20 having a wafer surface 21 and a plurality of sensing chips 23. Each sensing chip has a sensing portion and a plurality of pads. A stress release layer is covered on the active surface of the sensing wafer, and exposes the pads and the sensing portion, so as to form a plurality of pad areas and sensing areas. A photoresist layer is covered on a surface of the stress release layer, and openings are formed at positions corresponding to the pad areas to expose the pad areas 233.

Thereafter, referring to FIG. 2K, the wafer level sensing package formed by the above process includes the following components. A wafer 20 is constituted by a plurality of sensing chips 23 and a plurality of scribe lines 50. The wafer 20 has a wafer surface 21 and a wafer backside 22 opposite to the wafer surface 21. Each sensing chip 23 of the wafer surface 21 has an active surface, and the active surface has a sensing area 231 and a plurality of pads 232. A stress release layer 24 is located on the wafer surface 21 of the sensing chip 23 of the wafer 20, and exposes the sensing area 231 and the pads 232. A conductive metal layer 26 is disposed on a surface of the stress release layer 24 and electrically coupled to the pads 232. A plurality of re-distributed pads 261 is formed on the conductive metal layer 26. A plurality of conductive bumps 29 is respectively electrically coupled to each re-distributed pad 261.

Figure 4A:
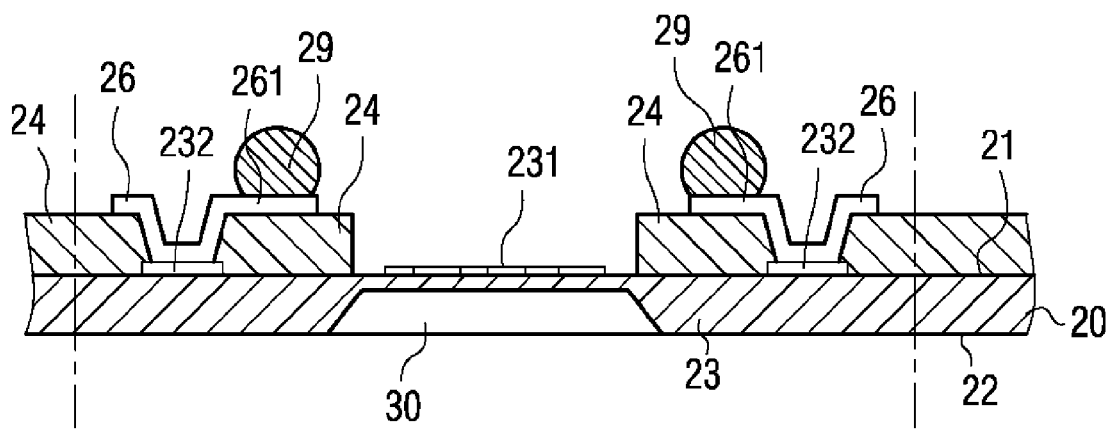
FIG. 4A is a schematic view of a thin film sensor of a wafer level sensing package according to an embodiment of the present invention.
Figure 4B:
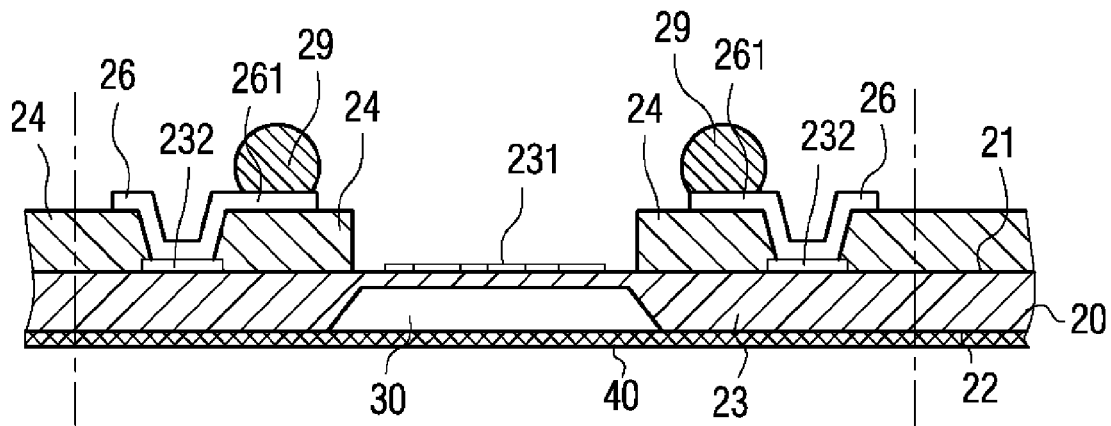
FIG. 4B is a schematic view of a thin film sensor and a reinforcement plate of a wafer level sensing package according to an embodiment of the present invention.
Figure 4C:
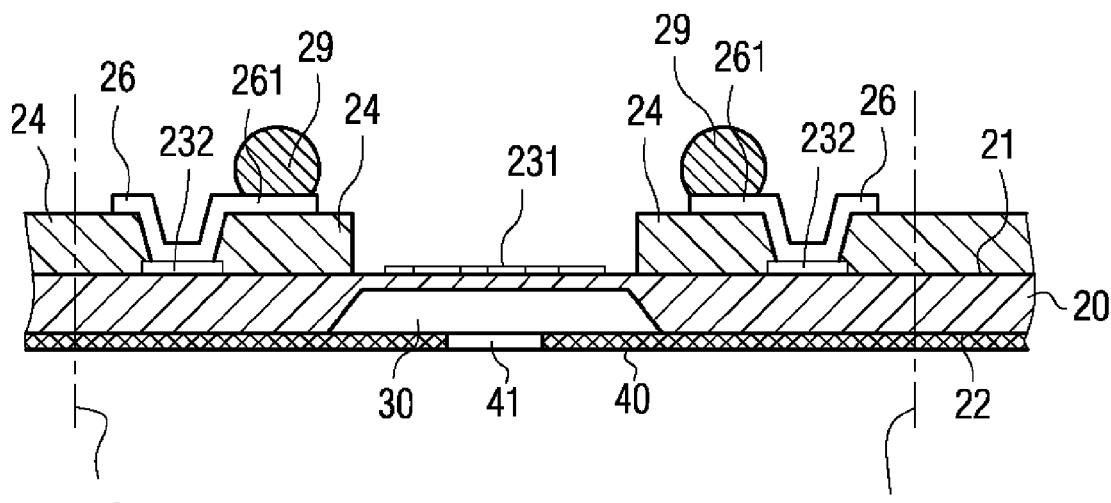
FIG. 4C is a schematic view of a thin film sensor and a reinforcement plate having a through hole of a wafer level sensing package according to an embodiment of the present invention.

Again referring to FIG. 4A, a schematic view of a thin film sensor of a wafer level sensing package according to an embodiment of the present invention is shown. In the wafer level sensing package, a cavity 30 is disposed on a wafer backside 22 opposite to the sensing area 231 of each sensing chip 23 of the wafer 20, and is located at the position corresponding to the sensing area 231. FIG. 4B is a schematic view of a thin film sensor and a reinforcement plate of a wafer level sensing package according to an embodiment of the present invention. In the embodiment of FIG. 4A, the wafer backside 22 further has a reinforcement plate 40 for compensating the stress loss of the wafer 20 formed with the cavities 30. In addition, FIG. 4C is a schematic view of a thin film sensor and a reinforcement plate having a through hole of a wafer level sensing package according to an embodiment of the present invention. In the embodiment of FIG. 4B, a through hole 41 is formed at a position corresponding to each cavity 30 in the reinforcement plate 40.

What is claimed is:

1. A manufacturing process of a wafer level sensing package, comprising:
    providing a wafer having a plurality of sensing chips, wherein the wafer has a wafer surface, and each sensing chip on the wafer surface further has a sensing area and a plurality of pads that do not overlap the sensing area;
    forming a stress release layer on the wafer surface, and patterning the stress release layer to expose the sensing area and the pads;
    cladding a photoresist layer on the stress release layer to shelter the sensing area and the pads;
    patterning the photoresist layer to expose a plurality of portions of the stress release layer, to thereby define a plurality of re-distributed pad reservation areas, and to expose the pads, each of the plurality of re-distributed pad reservation areas being connected to a corresponding one of the pads;
    forming a conductive metal layer on the plurality of re-distributed pad reservation areas, to thereby form a plurality of re-distributed pads each corresponding to and being connected to one of the pads, and on the photoresist layer and the pads;
    removing the photoresist layer, and the conductive metal layer formed thereon;
    forming a re-cladding photoresist layer on the stress release layer and the conductive metal layer to shelter the sensing area and the pads;
    patterning the re-cladding photoresist layer to form a plurality of holes in the re-cladding photoresist layer above the re-distributed pads;
    forming a conductive bump in each hole to electrically connect to the conductive metal layer; and
    removing the re-cladding photoresist layer to thereby expose the sensing area.

2. The manufacturing process of a wafer level sensing package according to claim 1, wherein the step of forming a conductive bump in each hole to electrically connect to the conductive metal layer further comprises a step of removing the re-cladding photoresist layer and a step of performing a reflow process, and the orders of the two steps are exchangeable.

3. The manufacturing process of a wafer level sensing package according to claim 1, wherein the conductive metal layer is formed by electro-plating, vapor deposition, or sputtering.

4. The manufacturing process of a wafer level sensing package according to claim 1, after the step of forming a conductive bump in each hole to electrically connect to the conductive metal layer, further comprising a step of cutting along adjacent positions of each sensing chip of the wafer to form a plurality of granular sensing chip packages.

5. The manufacturing process of a wafer level sensing package according to claim 1, wherein a composition of the stress release layer is one selected from a group consisting of PI, BCB, and silica gel.

6. The manufacturing process of a wafer level sensing package according to claim 1, wherein the conductive bump is formed by electro-plating.

7. The manufacturing process of a wafer level sensing package according to claim 1, wherein a conductive bump is formed by directly disposing a solder ball in each hole, and the hole is pre-coated with a solder flux or solder paste.

8. The manufacturing process of a wafer level sensing package according to claim 1, wherein the conductive bump is a gold bump or a solder bump.

9. The manufacturing process of a wafer level sensing package according to claim 1, wherein the photoresist layer or re-cladding photoresist layer is cladded by a general thick film forming process comprising stencil printing, spin-coating, or preformed plastic hot pressing.

10. The manufacturing process of claim 1, wherein, after removing the re-cladding photoresist layer to expose the sensing area, the sensing area is in communication with an outer environment of the wafer level sensing package.

* * * * *